United States Patent [19]

Tanizawa

[11] Patent Number: 4,721,995
[45] Date of Patent: Jan. 26, 1988

[54] INTEGRATED CIRCUIT SEMICONDUCTOR DEVICE FORMED ON A WAFER

[75] Inventor: Tetsu Tanizawa, Kawasaki, Japan

[73] Assignee: Fujitsu Limited, Kanagawa, Japan

[21] Appl. No.: 784,439

[22] Filed: Oct. 4, 1985

[30] Foreign Application Priority Data

Oct. 5, 1984 [JP] Japan ................... 59-209238

[51] Int. Cl.[4] ............ H01L 23/14; H01L 23/54; H01L 27/01
[52] U.S. Cl. .................. 357/80; 357/68/75
[58] Field of Search ............ 357/70, 68, 71, 80, 357/45, 72, 75

[56] References Cited

U.S. PATENT DOCUMENTS

| | | | |
|---|---|---|---|
| 4,021,838 | 5/1977 | Warwick | 357/70 |
| 4,136,356 | 1/1979 | Kusano | 357/70 |
| 4,246,595 | 1/1981 | Noyori et al. | 357/70 |

*Primary Examiner*—Martin H. Edlow
*Assistant Examiner*—S. V. Clark
*Attorney, Agent, or Firm*—Armstrong, Nikaido, Marmelstein & Kubovcik

[57] ABSTRACT

An integrated circuit semiconductor device of very large scale (VLSI) formed in a wafer, namely a wafer IC, is disclosed. In a wafer, a number of circuit blocks are formed in a matrix, being isolated from each other by an intermediate area locating between the circuit blocks. These circuit blocks are connected to interconnecting circuits which are formed on an insulative film in order to complete the wafer IC. The connection is performed by bonding corresponding bonding means, such as pads, disposed on the circuit blocks, repair chips and the interconnecting circuits by a conventional bonding process. With this structure of the wafer IC, the circuit blocks can be accessed easily by a computer aided testing apparatus in advance and the defective circuit blocks can be replaced by good ones, namely repair chips prepared in advance, without any rework of the interconnecting circuits. Bonding pads disposed on the circuit blocks and repair chips are arranged in a predetermined layout pattern for interchangeable bonding, by which the replacement of bad circuit blocks become possible regardless the location of the defective circuit blocks. Two types of the interconnecting film are disclosed for overcoming top surfaces of the repair chips, protruding from the surface of the wafer.

13 Claims, 11 Drawing Figures

INTEGRATED CIRCUIT SEMICONDUCTOR DEVICE FORMED ON A WAFER

BACKGROUND OF THE INVENTION

The present invention relates to a large scale integrated circuit (LSI) semiconductor device, more precisely, to a very large scale integrated (VLSI) circuit semiconductor device where the entire area of a semiconductor wafer or slice is used for fabricating the circuit thereof. It is especially involved with a device that can replace the wafer or the slice containing some defects in order to increase the production yield of the device.

Recently, LSI circuits are increasing its integration scale, and increasing its chip size. Along with this tendency, a VLSI circuit is made using the entire area of the wafer or slice (hereinafter it will be referred to simply as a wafer), called a wafer integration circuit or a wafer IC. The most serious problem in making the circuit is fabricating yield, because any defect in the wafer will not allow the device to be completed.

Many attempts to overcome above difficulties and realize the wafer IC have been tried by semiconductor manufacturers. For example, among a number of chips formed in a wafer, only good ones are selected, being interconnected to each other to form a VLSI, without separating the chips from the wafer. Using this method, the problem of defects on the wafer can be avoided. The method is preferable for a VLSI which includes plurality of the same circuitries, such as a memory device. However, the number of and the kind of the chips included in the wafer are limited, because every type of circuits in the wafer must have redundant chips of each type. Accordingly, it cannot be considered to be a real wafer IC.

Another attempt is to replace a bad chip or bad portion with a good one. One approach is to pile a good chip 8, namely a repair chip, on the bad chip or bad portion in the wafer 1, as shown in FIG. 1, and connect bonding pads 9 on the repair chip 8 to bonding pads 4 on the wafer 1 using bonding wires 12. Another approach is, as shown in FIG. 2, to bond a repair chip 8 which has bonding bumps 9B to bumps 4B formed on the bad portion in a face-down bonding.

In all of the above attempts, since the good chips selected in the wafer are distributed on the wafer 1 in a random manner, the bondings between the chips differs from wafer to wafer and from defect point to defect point. Accordingly, the spare chips for replacing the bad chips or bad portion therewith must be prepared for all the anticipated defects in the wafer. This is quite undesirable with mass production. Moreover, additional technology must be developed to cut off the bad chip or the bad portion electrically from the wafer and bond a new chip on the same position. Therefore, at the present moment, it is still not practical to fabricate the wafer IC device in large quantity by the state-of-the-art technology.

SUMMARY OF THE INVENTION

An object of the present invention, therefore, is to realize a VLSI semiconductor device having a scale extending over the entire area of a wafer, namely a wafer IC.

Another object of the present invention is to provide a standardized structure of a wafer IC suitable for wiring between good chips in the wafer and repair chips for replacing bad chips contained in the wafer therewith.

A further object of the present invention is to realize a wafer IC device suitable for production in large quantities.

In order to attain the above objects, the present invention designs a VLSI circuit into a plural number of circuit blocks. Each of the circuit blocks is allotted to one circuit block area in the wafer which corresponds to a chip area in an ordinary LSI wafer. Each of the circuit block areas has the same predetermined size, being arranged in a matrix just like in the ordinary LSI wafer. Furthermore, each circuit block area has the same bonding bumps arranged on the periphery of the circuit block area, in the same predetermined layout pattern. Thus, the appearance or the pattern of the circuit block areas is the same as that of the ordinary LSI wafer. The difference between the wafer IC and the ordinary LSI wafer is that each of the circuit block areas has different circuit blocks from each other, while each of those of the ordinary LSI wafer has the same circuit block.

Spacing between the circuit block areas of an ordinary wafer IC is also used for a different object from that of an ordinary LSI wafer. In the latter, the spacing is used for cutting the chips away from each other to make LSI chips individually, therefore, the spacing is referred to as a scribing space. While, in the former, the spacing is left blank, being used for isolating circuit blocks electrically from each other. The wiring, interconnecting the circuit blocks to each other, or connecting the circuit blocks to input/output terminals of the relevant package is performed on another insulative layer placed on the wafer as described later. Therefore, hereinafter, the spacing is referred to simply as an intermediate area. At this stage, the circuit blocks formed in the wafer are electrically isolated to each other. This serves to make possible checking each of circuit blocks for detecting bad circuit blocks more easily than checking the whole circuit after interconnecting the circuit blocks as the case of an ordinary wafer IC, because the circuit of each block is fairly small scale and easily accessible by a testing apparatus. In most cases, a computer aided testing method is applicable to the test, increasing its testing efficiency. This is one of the merits of the present invention.

Distinguished feature of the present invention appears in the interconnecting wiring method. The wiring is not done directly. No interconnecting wiring is formed on the wafer. The interconnecting wiring is done with a wiring patterns formed on an insulative film piled on the wafer. The wiring pattern has bonding pads corresponding to the bonding bumps, for instance, on the wafer in a predetermined layout pattern. The insulative film is placed on the wafer and aligned to the pattern on the wafer so that each of the bonding pads on the insulative film and the corresponding bonding bumps contact face-to-face. Thereafter, each facing pad and bump is bonded to each other.

A significant advantage of the present invention appears in a wiring method when some of the circuit blocks in the wafer have defects and should be replaced with repair chips. The circuit blocks on the wafer are tested individually before they are wired using a testing apparatus, desirably a computer aided testing apparatus, and if there is found a circuit block which is rejected by the testing, the bad circuit block is replaced by a repair chip. This is done by bonding a repair chip on the bad circuit block first. On the repair chip, a circuit which is the same as that of the bad circuit block is formed beforehand. When the repair chip is bonded on the wafer, the pattern on the repair chip is aligned to the pattern on the wafer. Therefore, after the alignment of the repair chip, the plan view of the entire wafer is just the same as that of the orginal wafer, except the protrusion of the top surface of the repair chip, where bonding pads are disposed in the predetermined pattern. The present invention provides two methods for wiring a repair chip to the relevant portion, different only in the overcoming method of the protruded top surface of the repair chip.

The first bonding structure contains two insulative films, a first film and a second film, having wiring patterns respectively formed thereon. The interconnecting wiring (circuits) formed on the first insulative film are arranged selectively on the portion which is to be placed just on the intermediate area of the wafer. The portions of the first insulative film corresponding to bad circuit blocks are punched off. The size of the punched off area is determined to be slightly larger than that of the circuit block, so the subsequent alignment of the first insulative film, namely, the remainder part of the interconnecting circuit pattern, with the pattern of the wafer can be performed without being affected by the repair chips already bonded to the wafer. Then the circuit pattern is bonded to the wafer leaving the repair chips unconnected. Since the shape and size of the circuit block area and the bonding pads on them are all equal to each other, it is unnecessary to vary the type of a tip of a punch head to punch off the insulative film, no matter where the defect on the wafer is located.

The repair chip bonded on the bad circuit block naturally protrudes its top surface from that of the first insulative film. A second insulative film, a repair insulative film, is placed on the repair chip, having a second wiring pattern which connects the bonding pads of the repair chip to the interconnecting circuit pattern on the first insulative film. The second wiring pattern, referred to as a connecting pattern, has two kinds of layout patterns of bonding pads: the one is the same predetermined layout pattern as that for the pads of circuit blocks, and the other is another predetermined layout pattern for pads connecting the circuit patterns on the first insulative film to that on the second insulative film, having a larger layout pattern than the circuit block on the wafer.

Thus, by bonding the second pattern on the second insulative film to the first pattern on the first insulative film, the bonding of the repair chip to the interconnecting circuit is completed. As mentioned above, the bonding pads and their layout on the circuit block area are all the same, the second pattern on the second insulative film can be applied to any circuit block, no matter where it is located. This is another merit of the present invention.

The second method is fairly simpler than the first method. It utilizes the flexibility of the insulative film. Since the layout pattern of the bonding pads on the wafer having repair chips bonded thereon is the same as that of a non-repaired wafer, a flexible insulative film having the same circuit pattern as that of the first embodiment can be used. The flexible insulative film is placed on the mended wafer, and the bonding pads on the wafer are aligned and bonded with the wiring pattern on the flexible insulative film, whereby protruded top surfaces of the repair chip are overcome by the deformation of the insulative film.

Still another merit of the present invention is in the preparation of spare chips reserved for the use as repair chips when some mending is required. If there are circuit blocks of n kinds on the wafer, it is necessary to prepare repair chips of n kinds for repairing defects at any part of the wafer. But it will be understood for the one in the art, that there occurs frequently wafers having a too many defects to be repaired therein. Such wafers are scribed like ordinary LSI chips, and good chips are selected and classified to each of the circuit block to be stored as the repair chips. Therefore, it is unnecessary to newly take the trouble to fabricate the repair chips of n kinds. Consequently, a rejected wafer can be reused for preparing repair chips, further increasing the total production yield of the Wafer ICs.

These together with other objects and advantages, which will be subsequently apparent, reside in the details, as more fully hereinafter described and claimed, reference being had to the accompanying drawings, wherein like numerals refer to like parts therethrough.

DESCRIPTION OF THE PREFERRED EMBODIMENTS

Figure 3A:
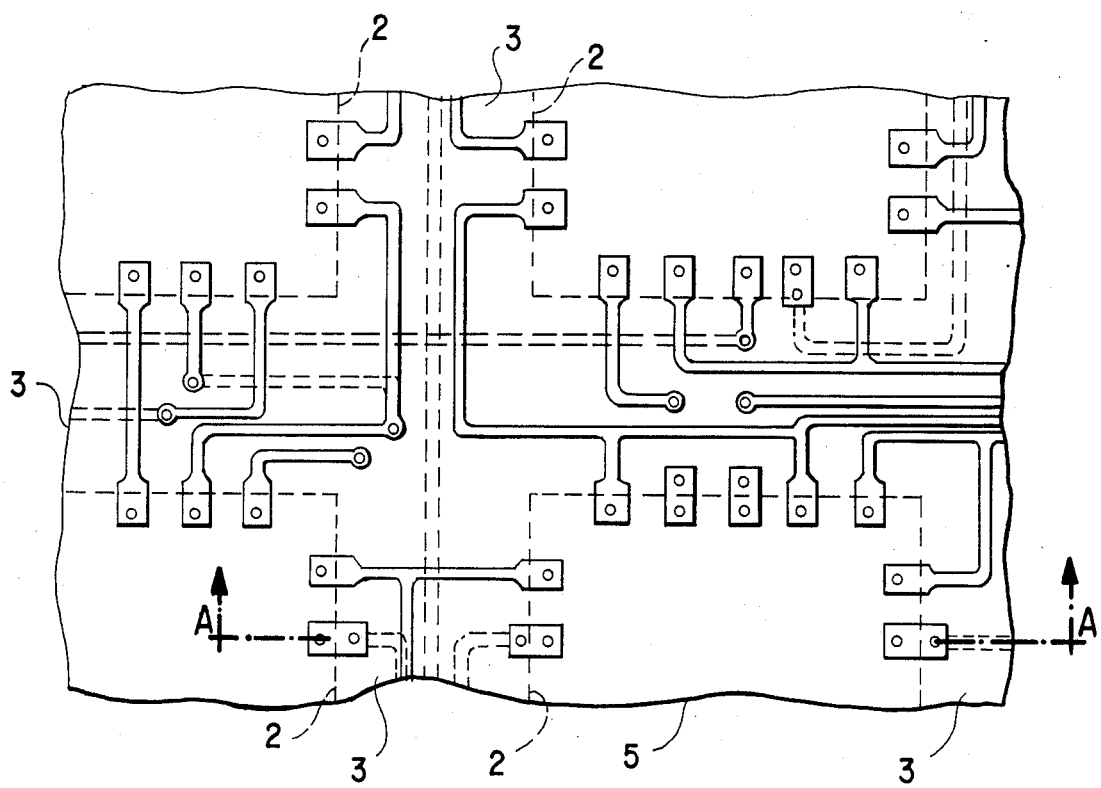
FIG. 3(a) is a partial plan view of an embodiment by the present invention containing no defect, illustrating its basic configuration.
Figure 3B:
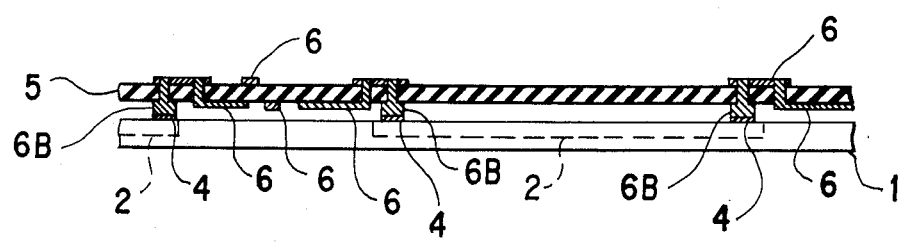
FIG. 3(b) is a partial cross-sectional view of an embodiment by the present invention containing no defect, illustrating its basic configuration.

The first embodiment is illustrated in a magnified partial plan view of FIG. 3(a) and cross-sectional views along the lines A—A of FIG. 3(b). A wafer IC by the present invention comprises a silicon wafer 1 and an interconnecting film.

Figure 1:
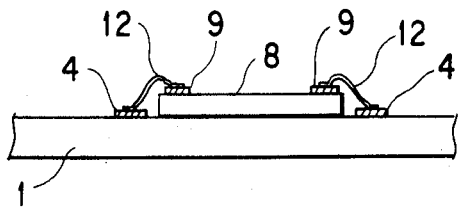
FIG. 1 is a partial schematic side view of a wafer IC, illustrating a prior art repairing method by replacing a bad circuit block with a good one, namely a repair chip.
Figure 2:
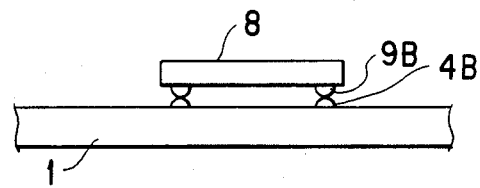
FIG. 2 is a partial schematic side view of a wafer IC, illustrating another prior art repairing method by replacing a bad circuit block with a good one, namely a repair chip.
Figure 4:
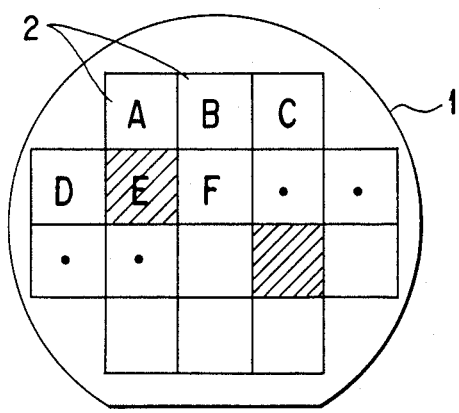
FIG. 4 is a schematic plan view of a wafer IC, illustrating arrangement of its circuit blocks.

In the silicon wafer 1, a number of circuit blocks 2 are formed by a conventional IC technology in a matrix arrangement. The areas for the circuit blocks 2 are represented with dotted lines in FIG. 3(a). A schematic plan view of the wafer 1 is also illustrated in FIG. 4, representing circuit blocks 2 designated by A, B, C, D, etc. An intermediate area 3 occupying the surface of the wafer 1 between the circuit blocks 2, as shown in FIG. 3(a), is a blank region wherein no wiring pattern is formed, thus electrically separating the circuit blocks 2 from each other. This enables each circuit block 2 to be accessed for testing at this fabrication stage very easily, because the scale of the circuit contained in each circuit block 2 is fairy simple sufficient to the application of an automatic computer aided testing system.

Figure 5:
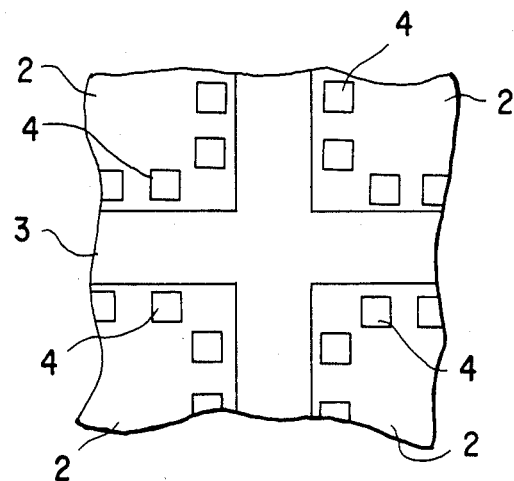
FIG. 5 is a schematic partial plan view of circuit block, illustrating arrangement of boding pads formed thereon.

Each circuit block 2 has pads 4 in its peripheral area as shown schematically in FIG. 5. The pads are arranged in a predetermined layout pattern. The type of the layout pattern is not always limited to be one type. Layout patterns of two or three types, for example, can be also employed depending on the circuit design. Particularly, when only one pattern of the circuit blocks 2 is adopted for standardization, various benefits of the fabricating process can be obtained, which will be shown later. However, according to requirements of design, circuits contained in the circuit blocks 2 may be different from one another.

The interconnecting film comprises an insulative film 5 which is made of a macromolecular compound such as polyimide material having a thickness of 10 μm to 100 μm order and an interconnecting circuit pattern 6. The circuit patterns 6 comprising various interconnecting circuits may be formed on the top surface and rear surface of the insulative film 5, and the connection between the both circuit patterns are achieved by conductive through-holes opened in the insulative film 5. Material and technology for forming the circuit patterns 6 are conventional ones, such as an etched copper foil circuit pattern. Hereby, the rear surface represents a surface to be placed facing to the surface of the wafer, and the top surface is the opposite surface.

The circuit patterns 6 are formed usually on the portion of the top and/or rear surfaces of the insulative film 5 just above the intermediate area 3 of the wafer 1. However this limitation is not always necessary except the third embodiment as described later. The circuit patterns 6 formed on the insulative film 5 has also bonding pads 6B disposed on the rear surface thereof, corresponding to the pads 4 of the circuit blocks 2 of the wafer 1.

Figure 8:
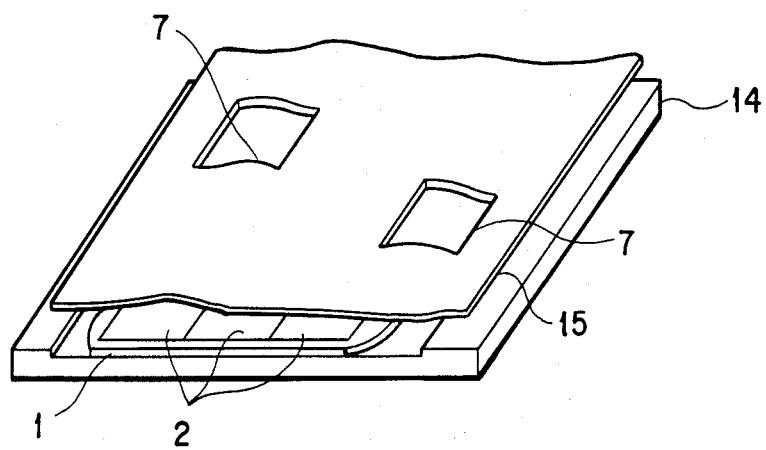
FIG. 8 is a perspective view of the embodiment of FIG. 7(a) and FIG. 7(b), illustrating relative arrangement of a metal base, a wafer and an interconnecting film.

Then, the wafer 1 is bonded on a base (not shown but being similar to a metal base 14 as shown in FIG. 8). The interconnecting film is placed on the wafer 1 in alignment, and each corresponding pad 4 and pad 6B are bonded to each other by a conventional method such as supersonic bonding. Thus, the wafer IC is completed.

As described before, a wafer IC, usually, can not be free from several defects ascribed to crystal defects of a silicon wafer 1 and fabrication faults of circuit blocks 6. These defects are located at random as indicated by hatched squares in FIG. 4. Thus, bad portions or bad circuit blocks are detected by electrical testing just after the completion of the circuit blocks 6 formed therein, and must be replaced with good ones, namely repair chips 8, prepared in advance. This replacement is inevitable at present moment. The most significant feature of the present invention is that such replacement of the bad circuit blocks can be performed without troublesome reworks of the associated portion of interconnecting circuits. The second and the third embodiments of the present invention disclose such wafer ICs as described in the following.

Figure 6A:
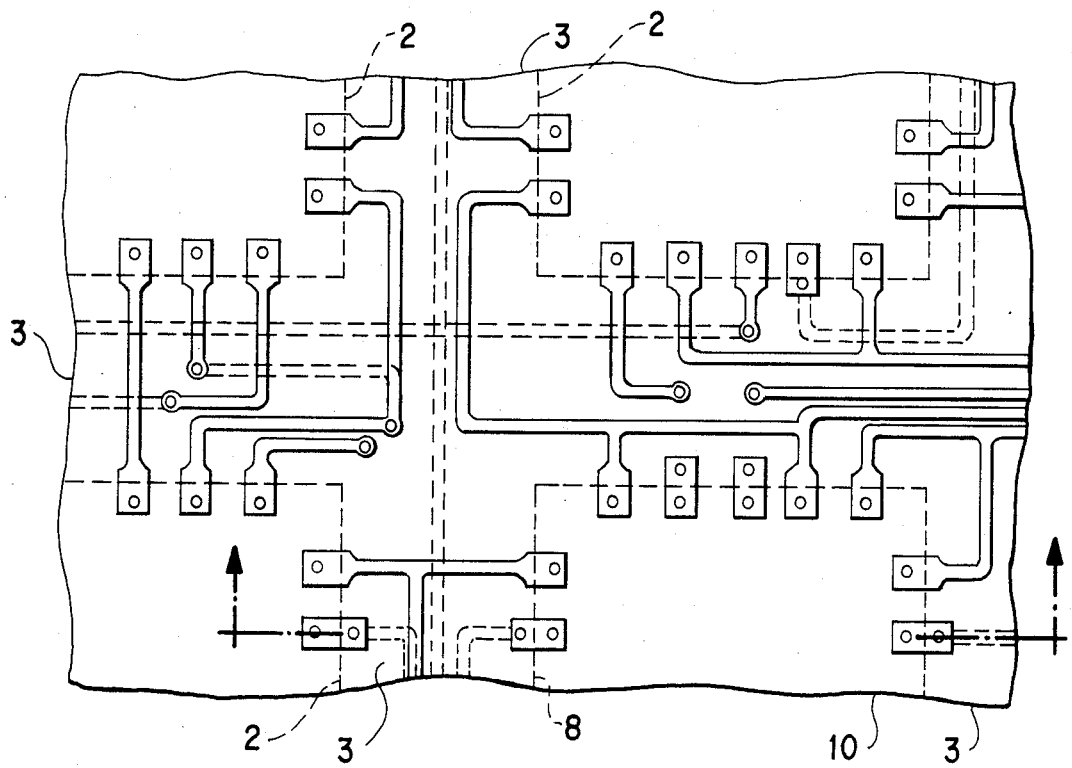
FIG. 6(a) is a partial plan view of an embodiment containing a defective circuit block and a repair chip bonded thereon, illustrating a repairing structure.
Figure 6B:
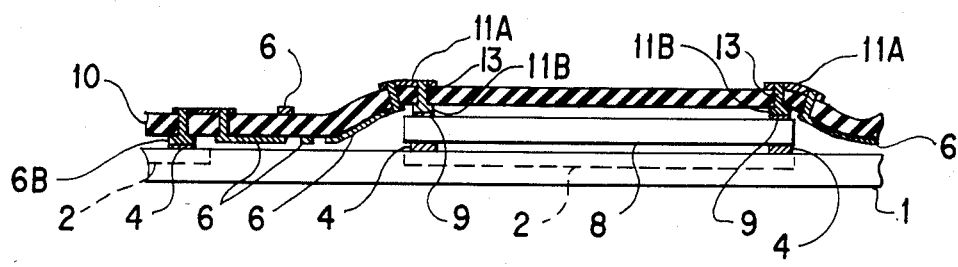
FIG. 6(b) is a partial cross-sectional view of an embodiment containing a defective circuit block and a repair chip bonded thereon, illustrating a repairing structure.

FIG. 6(a) and FIG. 6(b) are respectively a plan view and a cross-sectional view of the second embodiment, partially illustrating a portion where a replaced repair chip 8 is contained. Basic difference of the second embodiment from the first embodiment is that an interconnecting film has an insulative film 10 with some flexibility sufficient to overcome protruded top surface of the repair chip 8 bonded on a bad circuit block 2 of the wafer 1 for replacement. The material of the insulative film 10 is selected from macromolecular plastic materials such as polyimide plates used for conventional flexible printed circuit sheets. A transparent one is more suitable because a visual alignment of the pattern of the insulative film 10 with that of the wafer 1 is permitted.

An aluminum base is attached to the rear surface of the wafer 1 similarly as shown in FIG. 8. Thereafter, as shown in FIG. 6(b), the repair chip 8 is bonded to the pads 4 of a bad circuit block by a conventional method. Naturally, the top surface of the repair chip 8 is protruded from the surface of the wafer 1. The protruded top surface is overcome by the deformation of the insulative film 10, and the connection between the pads 9 of the repair chip 8 and the bonding means 11B, such as bonding bumps of the interconnecting circuit is performed in the same manner of the first embodiment. Thus the circuit blocks 2 including the repair chip 8 are connected to the interconnecting circuit pattern 6.

When a repair chip 8 has an uninsulated portion, such as side walls of its scribed substrate, a specially designed bonding means are prepared for connecting the repair chip 8 to avoid electrical shortage through the substrate of the repair chip. In a cross-sectional view of FIG. 6(b), an example of the above bonding mechanism is illustrated. A bonding bump 11B corresponding to a pad 9 of the repair chip 8 is formed on the rear surface of the insulative film 10. The bonding bump 11B is connected to a conductor (wiring) 11A on the top surface of the insulative film 10 through a through-hole 13, thus providing a non-wired (blank) portion on the rear surface of the insulative film 10 around the repair chip 8. As a result, the substrate of the repair chip 8 is kept apart from conductive members when the insulative film 10 is placed on the repair chip 8 and deformed towards the wafer surface. The structure of a bonding means of this type is used when a repair chip is prepared from a wafer IC containing too many defects: the wafer is scribed so that the circuit blocks 2 are divided into individual chips and good chips are selected to be used as repair chips whose scribed side walls are exposed and not insulated.

Figure 7A:
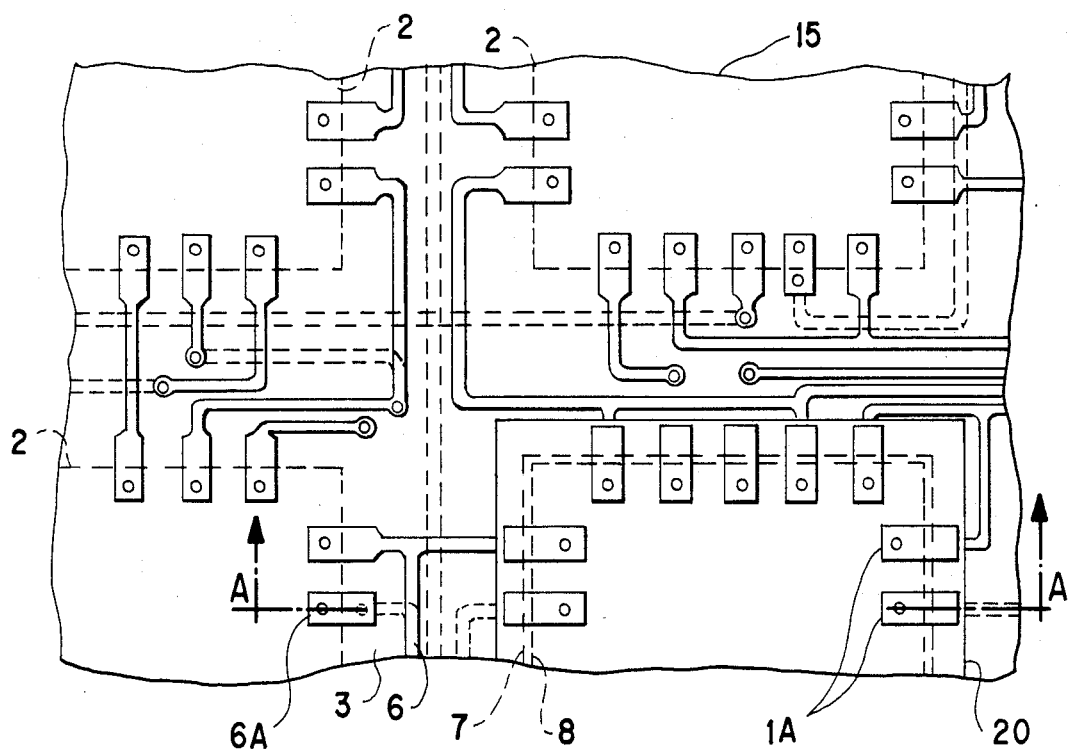
FIG. 7(a) is a partial plan view of an embodiment containing a defective circuit block and a repair chip bonded thereon, illustrating another repairing structure.
Figure 7B:
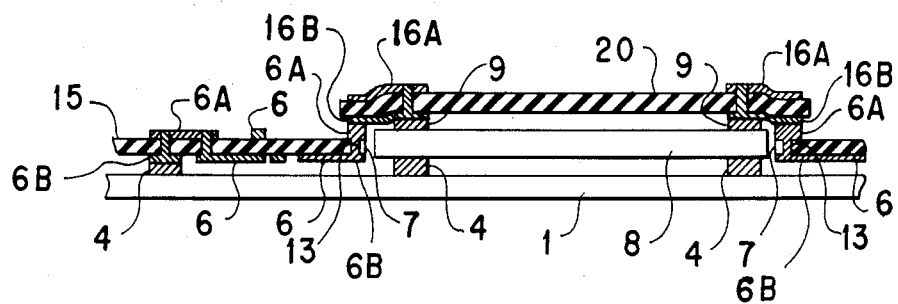
FIG. 7(b) is a partial cross-sectional view of an embodiment containing a defective circuit block and a repair chip bonded thereon, illustrating a repairing structure.

The third embodiment is illustrated in a plan view of FIG. 7(a) and in a cross-sectional view of FIG. 7(b). The wafer IC comprises a wafer 1, an interconnecting film and a repair film. The interconnecting film consists of an insulative film 15 and interconnecting circuit patterns 6 formed selectively on the portion of the insulative film 15 corresponding to the intermediate area 3 of the wafer 1. The repair film comprises a insulative film 20 and connecting pattern 16 formed thereon as shown in FIG. 7(a) and FIG. 7(b).

Bad circuit blocks 2 contained in a wafer 1 are replaced by repair chips 8. The protruding top surfaces of the repair chips 8 are overcome in a different way from the second embodiment. Corresponding to each defective (bad) circuit block detected by an intermediate checking, a hole 7 having a slightly larger size than that of the relevant repair chip 8 is opened in the insulative film 15. The hole 7 is represented by dot-dashed lines in FIG. 7(a). When the outer size of the circuit blocks 2, accordingly that of the corresponding repair chips 8, are determined in one standard dimension, the punching head of a single size can be used commonly for opening the holes 7, and the punching position can be controlled by a computer in which information of the location of the bad circuit blocks is stored in advance at the preceding testing of the wafer. Thus, these processes, intermediate checking of the wafer and the location of the punching head, are controlled by a computer system, raising its process efficiency.

In the third embodiment, bonding pads 6A and 6B are formed on the top and rear surfaces of the insulative film 15 respectively, being connected to each other through a through-hole 13. The bonding pad 6B has a longer size in comparison with that of the first and the second embodiments. The bonding pads 6B lies exceeding the punching line of a hole 7, extending to both direction. To a good circuit block 6 originally formed in the wafer 1, the portion inside the punching line of the bonding pad 6B is bonded to its pads 4, connecting the good circuit block to the interconnecting circuit pattern 6.

When a hole 7 is punched off on a bad circuit block 2, the portion of the bonding pads 6B within the punching line are lost to isolate the relevant bad circuit block 2 completely from the associated circuits. While, the connecting means 16B on the repair film 20 has two connecting portion resulting in its long rectangular shape. As easily understood by the figure of FIG. 7(a) and FIG. 7(b), the connection between interconnecting circuit pattern 6 and the repair chip 8 can be performed by the connecting means 16B, bridging the pads 9 of the repair chip 8 and the remaining bonding means 6A. Thus the repair chip 8 is connected to the interconnecting circuit to complete the wafer IC. The thickness of the insulative film 15 is desirably to be selected almost equal to that of the repair chip 8, such as 200 μm to 300 μm, so that the top surface of the repair chip 8 and that of the repair film 20 is placed on the same level. When the layout pattern of the pads 4 of the repair chips 8, and that of the bonding means 6B are standardized, a repair films 20 of one standard type can be used commonly, enabling the repair work substantially easy.

The insulative film 15 and the repair film 20 are made macromolecular plastic film such as polyimide.

The repair film is not always made in a small shape containing a pair of connecting means to be used for one repair chip only as shown in FIG. 7(a) and 7(b). There can be used a common repair film (not shown in a figure) having many pairs of the connecting means having the same pattern and locating in positions corresponding to all of the circuit blocks 2 on the wafer 1. Of course, each connecting means on an insulative film is isolated each other and the connecting means facing defective circuit blocks are used as individual repair film, being bonded to corresponding defective circuit blocks through each holes 7 opened in the insulative film 15. The "integrated" repair film is convenient for handling and alignment of the repair film, particularly a number of defective circuit blocks exist on the wafer.

The present invention may be embodied in other specific forms without departing from the spirit or essential characteristics thereof. The presently disclosed embodiments, are, therefore, to be considered in all respects as illustrative, the scope of the invention being indicated by the appended claims, rather than the foregoing description, and all changes which come within the meaning and range of equivalency of the claims are therefore, to be embraced therein.

What is claimed is:

1. An integrated circuit semiconductor device comprising:
    a semiconductor wafer having a plurality of circuit blocks formed therein and an intermediate area formed in said semiconductor wafer between said circuit blocks, electrically isolating said circuit blocks from each other, each of said circuit blocks has a plurality of first bonding means having a predetermined layout pattern thereon; and
    an interconnecting film comprising an insulating film and an interconnecting circuit formed on a surface of said insulative film, said interconnecting circuit has a plurality of second bonding means on a surface of said insulative film arranged corresponding to said first bonding means,
    said interconnecting film being placed in alignment on said semiconductor wafer and said interconnecting circuit being connected to said circuit blocks to complete said integrated circuit semiconductor device by said second bonding means being bonded to said corresponding first bonding means.

2. An integrated circuit semiconductor device of claim 1, wherein said circuit blocks are arranged in a matrix.

3. An integrated circuit semiconductor device comprising:
    a semiconductor wafer having a plurality of circuit blocks formed therein containing a defective circuit block and an intermediate area formed in said semiconductor wafer between said circuit blocks, electrically isolating said circuit blocks from each other, said circuit blocks having a plurality of first bonding means arranged in a predetermined layout pattern thereon;
    a flexible interconnecting film comprising an flexible insulating film and an interconnecting circuit formed on said insulative film, said interconnecting circuit having a plurality of second bonding means formed on a surface of said insulative film corresponding to said first bonding means;
    a repair chip bonded on said defective circuit block, said repair chip having a replaceable circuit with that of said defective circuit block, said repair chip having a plurality of plurality of first bonding means arranged in said predetermined layout pattern;
    said flexible interconnecting film being placed in alignment on said semiconductor wafer and said repair chip and said interconnecting circuit being connected to said circuit blocks and to said repair chip to complete said integrated circuit semiconductor device by said second bonding means being bonded to said corresponding first bonding means, wherein the protruded top surface of said repair chip being wrapped by said flexible interconnecting film with the aid of the elasticity of said flexible insulative film.

4. An integrated circuit semiconductor device of claim 6, wherein said circuit blocks and said repair chip are arranged in a matrix.

5. An integrated circuit semiconductor device comprising:
a semiconductor wafer having a plurality of circuit blocks formed therein containing a defective circuit block and an intermediate area formed in said semiconductor wafer between said circuit blocks, electrically isolating said circuit blocks from each other, said circuit blocks having a plurality of plurality of first bonding means arranged in a first predetermined layout pattern;
a repair chip bonded on said defective circuit block, said repair chip having a replaceable circuit with that of said defective circuit block, said repair chip having a plurality of first bonding means arranged in said first predetermined layout pattern;
an interconnecting film comprising an insulative film and an interconnecting circuit formed thereon, said interconnecting film having a hole opened at the corresponding location to said defective circuit block in said semiconductor wafer, said hole being a same shape but a slightly larger size than that of said repair chip, said interconnecting circuit formed on said insulative film has a plurality of second bonding means arranged in said first predetermined layout pattern corresponding to said first bonding means, and a plurality of third bonding means arranged in a second predetermined layout pattern, each of said second bonding means is connected to each of said third bonding means; and
a repair film comprising an insulative film and a plurality of connecting means formed on a surface of said insulative film for connecting said repair chip to said interconnecting circuit of said interconnecting film, each of said connecting means formed on said repair film comprises a fourth bonding means, fifth bonding means and a conductor connecting said fourth bonding means and fifth bonding means, said fourth bonding means being arranged in said first predetermined layout pattern and said fifth bonding means being arranged in said second predetermined layout pattern,
said interconnecting film being placed on said semiconductor wafer in alignment with said circuit blocks of said semiconductor wafer, and said interconnecting circuit thereon being connected to said circuit blocks of said semiconductor wafer except said repair chip, and said repair film being placed on said repair chip in alignment, connecting said repair chip to said interconnecting circuit on said interconnecting film therethrough, by said second bonding means being bonded to said corresponding first bonding means, thus connecting circuit blocks to said interconnecting circuit.
said fourth bonding means being bonded to said corresponding first bonding means of said repair chip, said fifth bonding means are bonded to said third bonding means.

6. An integrated circuit semiconductor device of claim 5, wherein said circuit blocks and said repair chip are arranged in a matrix.

7. An integrated circuit semiconductor device of claim 5, wherein said interconnecting wiring is formed only on a portion of said surface of said insulating film correspondingly facing to said intermediate area of said wafer.

8. An integrated circuit semiconductor device of claim 5, wherein said repair film has a plurality of said connecting means corresponding to each of said all circuit blocks of said semiconductor wafer.

9. An integrated circuit semiconductor device of any one of claims 2, 3, 4, 5, 6, 7, or 8, wherein said insulative film is made of macromolecular compound such as polyimide.

10. An integrated circuit semiconductor device of one of claims 2, 3, 4, 5, 6, 7, or 8, wherein said insulative film is transparent.

11. An integrated circuit semiconductor device according to claim 1 wherein said interconnecting circuits are formed on at least one of a top surface and a rear surface of said insulative film.

12. An integration circuit semiconductor device according to claim 11 wherein said interconnecting circuits of said top surface and said rear surface of said insulative film are connected by through-holes in said insulative film.

13. An integration circuit semiconductor device according to claim 1 wherein said interconnecting circuit is formed above said intermediate area on a portion of at least one of a top surface and a rear surface of said insulative film.

* * * * *